(12) United States Patent
Kim et al.

(10) Patent No.: US 9,275,852 B2
(45) Date of Patent: Mar. 1, 2016

(54) SUBSTRATE TREATING APPARATUS AND SUBSTRATE TREATING METHOD

(71) Applicant: Semes Co., Ltd., Cheonan-si, Chungcheongnam-do (KR)

(72) Inventors: KiBong Kim, Cheonan-si (KR); Boong Kim, Cheonan-si (KR); Gil Hun Song, Cheonan-si (KR); Oh Jin Kwon, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 455 days.

(21) Appl. No.: 13/905,754

(22) Filed: May 30, 2013

(65) Prior Publication Data

US 2013/0318815 A1    Dec. 5, 2013

(30) Foreign Application Priority Data

May 31, 2012  (KR) .................. 10-2012-0058228
Aug. 27, 2012  (KR) .................. 10-2012-0093798

(51) Int. Cl.

| H01L 21/00 | (2006.01) |
|---|---|
| B08B 3/04 | (2006.01) |
| F26B 5/00 | (2006.01) |
| H01L 21/02 | (2006.01) |
| F26B 21/14 | (2006.01) |
| H01L 21/67 | (2006.01) |
| B08B 7/00 | (2006.01) |
| F26B 21/12 | (2006.01) |

(52) U.S. Cl.
CPC ........ *H01L 21/02101* (2013.01); *B08B 7/0021* (2013.01); *F26B 21/14* (2013.01); *H01L 21/67017* (2013.01); *H01L 21/67034* (2013.01); *H01L 21/67051* (2013.01); *F26B 21/12* (2013.01)

(58) Field of Classification Search
CPC ................. H01L 21/02101; H01L 21/067034; Y10S 134/902; B08B 7/0021; F26B 21/14; F26B 7/00
See application file for complete search history.

(56) References Cited

FOREIGN PATENT DOCUMENTS

| CN | 1371462 A | 9/2002 |
|---|---|---|
| CN | 1779920 A | 5/2006 |
| JP | 2002336677 A | 11/2002 |
| JP | 2005252234 A | 9/2005 |
| JP | 2006130386 A | 5/2006 |
| JP | 2007175559 A | 7/2007 |
| JP | 2007-234862 A | 9/2007 |
| JP | 2008078322 A | 4/2008 |
| JP | 2009194092 A | 8/2009 |
| KR | 2012-0008134 A | 1/2012 |

*Primary Examiner* — David J Laux
(74) *Attorney, Agent, or Firm* — Harness, Dickey & Pierce

(57) ABSTRACT

Provided is an apparatus for treating a substrate using a supercritical fluid. The substrate treating apparatus includes a housing, a support member disposed within the housing to support the substrate, a supercritical fluid supply unit in which the supercritical fluid is stored, a supply tube connecting the supercritical fluid supply unit to the housing to adjust an amount of supercritical fluid supplied from the supercritical fluid supply unit into the housing, and a vent tube branched from the supply tube to discharge the supercritical fluid remaining in the supply tube. A switching valve opening or closing the vent tube is disposed in the vent tube.

16 Claims, 10 Drawing Sheets

SUBSTRATE TREATING APPARATUS AND SUBSTRATE TREATING METHOD

CROSS-REFERENCE TO RELATED APPLICATIONS

This U.S. non-provisional patent application claims priority under 35 U.S.C. §119 of Korean Patent Application Nos. 10-2012-0058228, filed on May 31, 2012, and 10-2012-0093798, filed on Aug. 27, 2012, the entire contents of which are hereby incorporated by reference.

BACKGROUND OF THE INVENTION

The present disclosure herein relates to an apparatus and method for treating a substrate, and more particularly, to an apparatus and method for treating a substrate using a supercritical fluid.

Semiconductor devices are manufactured through various processes including a photolithography process in which a circuit pattern is formed on a substrate such as a silicon wafer. While the semiconductor devices are manufactured, various foreign substances such as particles, organic contaminants, metal impurities, and the like may be generated. These foreign substances may cause substrate defects to directly exert a bad influence on performance and yield of semiconductor devices. Thus, a cleaning process for removing the foreign substances may be essentially involved in a semiconductor device manufacturing process.

The cleaning process includes a chemical process of removing foreign substances on a substrate, a washing process of washing chemicals by using deionized water, and a drying process of drying the substrate. A typical drying process is performed by replacing the DI water existing on the substrate with an organic solvent such as isopropyl alcohol (IPA) to evaporate the IPA.

However, such a drying process may cause pattern collapse as ever in a semiconductor device having a fine circuit pattern with a line width of about 30 nm or less even though the organic solvent is used. Thus, the current trend is an increase in replacement of the existing drying process with a supercritical drying process.

SUMMARY OF THE INVENTION

The present invention provides a substrate treating apparatus that is capable of efficiently performing a drying process by using a supercritical fluid.

The present invention also provides a substrate treating apparatus that prevents a fluid except for a supercritical fluid from being supplied into a housing.

Embodiments of the present invention provide apparatuses for treating a substrate using a supercritical fluid, the apparatuses including: a housing; a support member disposed within the housing to support the substrate; a supercritical fluid supply unit in which the supercritical fluid is stored; a supply tube connecting the supercritical fluid supply unit to the housing; and a vent tube branched from the supply tube to discharge the supercritical fluid remaining in the supply tube, wherein a supply valve adjusting an amount of supercritical fluid supplied from the supercritical fluid supply unit into the housing is disposed in the supply tube, wherein a switching valve opening or closing the vent tube is disposed in the vent tube.

In some embodiments, a flow rate adjustment member adjusting a flow rate of the supercritical fluid flowing into the vent tube may be disposed in the vent tube.

In other embodiments, the flow rate adjustment member may include a metering valve or an orifice.

In still other embodiments, the flow rate adjustment member may be disposed on a side opposite to a side at which the vent tube is connected to the supply tube with respect to the switching valve.

In even other embodiments, the supply tube may include: a main tube having one end connected to the supercritical fluid supply unit; an upper supply tube branched from a branch part disposed on the other end of the main tube, the upper supply tube being connected to an upper portion of the housing; and a lower supply tube branched from the branch part, the lower supply tube being connected to a lower portion of the housing.

In yet other embodiments, the vent tube may be branched from one point of the main tube, the upper supply tube, or the lower supply tube.

In further embodiments, the supply valve may include a main valve, an upper valve, and a lower valve which are respectively disposed in the main tube, the upper supply tube, and the lower supply tube.

In still further embodiments, the vent tube may be branched between the branch part and the main valve, the upper valve, or the lower valve.

In even further embodiments, a filter may be disposed between the main valve and the branch part in the main tube.

In yet further embodiments, the supply valve may include a front valve adjacent to the supercritical fluid supply unit and a rear valve adjacent to the housing, and the vent tube may be branched between the front valve and the rear valve.

In much further embodiments, the apparatuses may further include a controller controlling the supply valve and the switching valve, wherein the controller may open the switching valve in a state where the supply valve is closed to discharge the supercritical fluid remaining in the supply tube through the vent tube.

In other embodiments of the present invention, methods for treating a substrate using the substrate treating apparatuses include: opening the switching valve in a state where the supply valve is closed to discharge the supercritical fluid remaining the supply tube into the vent tube; and closing the switching valve and opening the supply valve to supply the supercritical fluid into the housing.

In some embodiments, while the supercritical fluid is discharged into the vent tube, the substrate may be unloaded from the housing or loaded into the housing.

In still other embodiments of the present invention, methods for treating a substrate using the substrate treating apparatuses include, when the substrate is completely dried, discharging the supercritical fluid remaining the supply tube while discharging the supercritical fluid within the housing in a state where introduction of the supercritical fluid from the supercritical fluid supply unit into the supply tube is blocked.

In some embodiments, when the substrate is loaded into the housing, the supercritical fluid remaining in the supply tube may be discharged into the vent tube, and supply of the supercritical fluid from the supercritical fluid supply unit into the housing through the supply tube may start.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
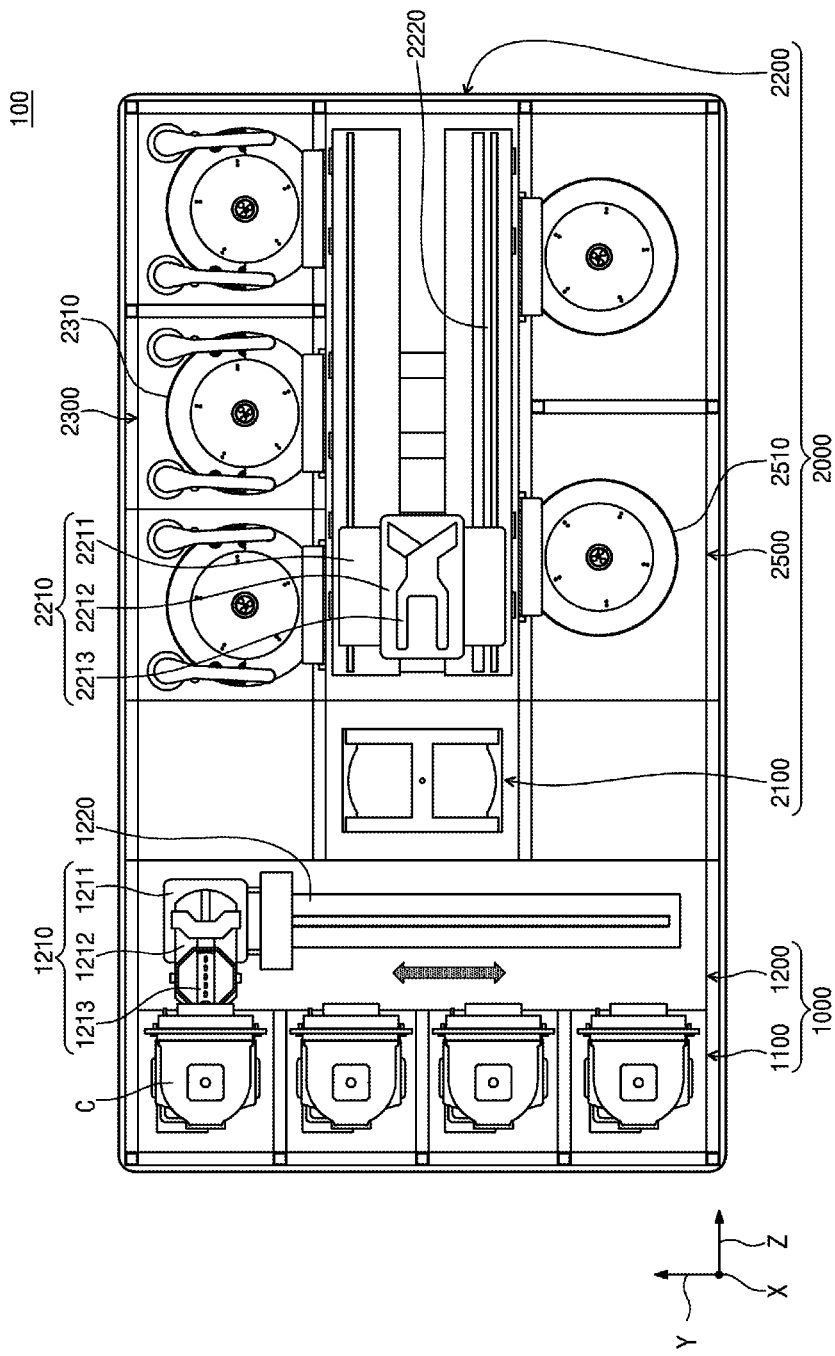
FIG. 1 is a plan view of a substrate treating apparatus according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity.

FIG. 1 is a plan view of a substrate treating apparatus according to an embodiment of the present invention.

Referring to FIG. 1, a substrate treating apparatus 100 includes an index module 1000 and a process module 2000.

The index module 1000 may be an equipment front end module (EFEM). Also, the index module 1000 includes a load port and a transfer frame 1200. The index module 1000 receives a substrate S from the outside to provide the substrate S into the process module 2000.

The load port 1100, the transfer frame 1200, and the process module 2000 may be successively arranged in a line. Here, a direction in which the load port 1100, the transfer frame 1200, and the process module 2000 are arranged is referred to as a first direction X. Also, when viewed from an upper side, a direction perpendicular to the first direction X is referred to as a second direction Y, and a direction perpendicular to the first and second directions X and Y is referred to as a third direction Z.

At least one load port 1100 may be provided in the index module 1000. The load port 1100 is disposed on a side of the transfer frame 1200. When the load port 1100 is provided in plurality, the plurality of load ports 1100 may be arranged in a line along the second direction Y. The number and arrangement of load ports 1100 are not limited to the above-described example. For example, the number and arrangement of load ports 1100 may be changed according to a foot print, process efficiency, and arrangement with respect to the other substrate treating apparatuses 100. A carrier C in which the substrate C is received is disposed on the load port 1100. The carrier C is transferred from the outside and then loaded on the load port 1100, or is unloaded from the load port 1100 and then transferred into the outside. For example, the carrier C may be transferred between the apparatuses 100 for treating a substrate by a transfer unit such as an overhead hoist transfer (OHT). Here, the substrate S may be transferred by other transfer units such as an automatic guided vehicle, a rail guided vehicle, and the like, instead of the OHT, or a worker.

The substrate S is received into the carrier C. A front opening unified pod (FOUP) may be used as the carrier C. At least one slot supporting an edge of the substrate S may be disposed within the carrier C. When a plurality of slots are provided, the plurality of slots may be spaced apart from each other along the third direction Z. Thus, the substrate S may be placed within the carrier C. For example, the carrier C may receive twenty-five substrates S. The inside of the carrier C may be isolated from the outside by an openable door and thus be sealed. Thus, it may prevent the substrate S received in the carrier C from being contaminated.

The transfer module 1200 includes an index robot 1210 and an index rail 1220. The transfer frame 1200 transfers the substrate S between the carrier C seated on the load port 1100 and the process module 2000.

The index rail 1220 provides a moving path of the index robot 1210. The index rail 1220 may be disposed in a length direction thereof parallel to the second direction Y. The index robot 1210 transfers the substrate S.

The index robot 1210 may include a base 1211, a body 1212, and an arm 1213. The base 1211 is disposed on the index rail 1220. Also, the base 1211 may be moved along the index rail 1220. The body 1212 is coupled to the base 1211. Also, the body 1212 may be moved along the third direction Z on the base 1211 or rotated around an axis defined in the third direction Z. The arm 1213 is disposed on the body 1212. Also, the arm 1213 may be moved forward and backward. A hand may be disposed on an end of the arm 1213 to pick up or place the substrate S. The index robot 1210 may include one or a plurality of arms 1213. When the plurality of arms 1213 are provided, the plurality of arms 1213 may be stacked on the body 1212 and arranged in the third direction Z. Here, the plurality of arms 1213 may be independently operated. Thus, in the index robot 1210, the base 1211 may be moved in the second direction Y on the index rail 1220. Also, the index robot 1210 may take the substrate S out of the carrier C to transfer the substrate S into the process module 2000 or take the substrate S out of the process module 2000 to receive the substrate S into the carrier C.

Also, the index rail 1220 may be omitted in the transfer frame 1200, and the index robot 1210 may be fixed to the transfer frame 1200. In this case, the index robot 1210 may be disposed on a central portion of the transfer frame 1200.

The process module 2000 includes a buffer chamber 2100, a transfer chamber 2200, a first process chamber 2300, and a second process chamber 2500. The process module 2000 receives the substrate S from the index module 1000 to perform a cleaning process on the substrate S. The buffer chamber 2100 and the transfer chamber 2200 are disposed along the first direction X, and the transfer chamber 2200 is disposed in a length direction thereof parallel to the first direction X. The process chambers 2300 and 2500 may be disposed on a side surface of the transfer chamber 2200 in the second direction Y. Here, the first process chamber 2300 may be disposed on one side of the transfer chamber 2200 in the second direction Y, and the second process chamber 2500 may be disposed on the other side opposite to the one side on which the first process chamber is disposed. The first process chamber 2300 may be provided in one or plurality. When the plurality of first process chambers 2300 are provided, the first process chambers 2300 may be disposed on one side of the transfer chamber 2200 along the first direction X, stacked along the third direction Z, or disposed in combination thereof. Also, the second process chamber 2500 may be provided in one or plurality. When the plurality of second process chambers are provided, the second process chambers may be disposed along the first direction X on the other side of the transfer chamber 2500, stacked along the third direction Z, or disposed in combination thereof.

However, the arrangement of each of the chambers 2100, 2200, 2300 and 2500 in the process module 2000 is not limited to the above-described example. That is, the chambers 2100, 2200, 2300, and 2500 may be adequately disposed in consideration of process efficiency. For example, as necessary, the first and second process chambers 2300 and 2500 may be disposed along the first direction X on the same side surface as the transfer module 2200 or stacked on each other.

The buffer chamber 2100 is disposed between the transfer frame and the transfer chamber 2200. The buffer chamber 2100 provides a buffer space in which the substrate S transferred between the index module 1000 and the process module 2000 temporarily stays. At least one buffer slots on which the substrate S is placed may be provided within the buffer chamber 2100. When a plurality of buffer slots are provided, the plurality of buffer slots may be spaced apart from each other along the third direction Z. The substrate S taken out of the carrier C by the index robot 1210 may be seated on the buffer slot, or the substrate C transferred from the process chambers 2300 and 2500 by the transfer robot 2210 of the transfer chamber 2200 may be seated on the buffer slot. Also, the index robot 1210 or the transfer robot 2210 may take the substrate S out of the buffer slot to receive the substrate S into the carrier C or transfer the substrate S into the process chambers 2300 and 2500.

The transfer chamber 2200 transfers the substrate S between the chambers 2100, 2300, and 2500 disposed therearound. The buffer chamber 2100 may be disposed on one side of the transfer chamber 2200 in the first direction X. The process chambers 2300 and 2500 may be disposed on one side or both sides of the transfer chamber 2200 in the second direction Y. Thus, the transfer chamber 2200 may transfer the substrate S between the buffer chamber 2100, the first process chamber 2300, and the second process chamber 2500. The transfer chamber 2200 includes a transfer rail 2220 and a transfer robot 2210.

The transfer rail 2220 provides a moving path of the transfer robot 2210. The transfer rail 2220 may be disposed parallel to the first direction X. The transfer robot 2210 transfers the substrate S. The transfer robot 2210 may include a base 2211, a body 2212, and an arm 2213. Since each component of the transfer robot 2210 is similar to that of the index robot 1210, detailed descriptions thereof will be omitted. The transfer robot 2210 transfers the substrate S between the buffer chamber 2100, the first process chamber 2300, and the second process chamber 2500 by operations of the body 2212 and the arm 2213 while the base 2211 is moved along the transfer rail 2220.

The first and second process chambers 2300 and 2500 may perform processes different from each other on the substrate S. Here, a first process performed in the first process chamber 2300 and a second process performed in the second process chamber 2500 may be successively performed. For example, a chemical process, a cleaning process, and a first drying process may be performed in the first process chamber 2300. Also, a second drying process that is a subsequent process of the first process may be performed in the second process chamber 2500. Here, the first drying process may be a wet drying process performed using an organic solvent, and the second drying process may be a supercritical drying process performed using a supercritical fluid. As necessary, only one of the first and second drying processes may be selectively performed.

Figure 2:
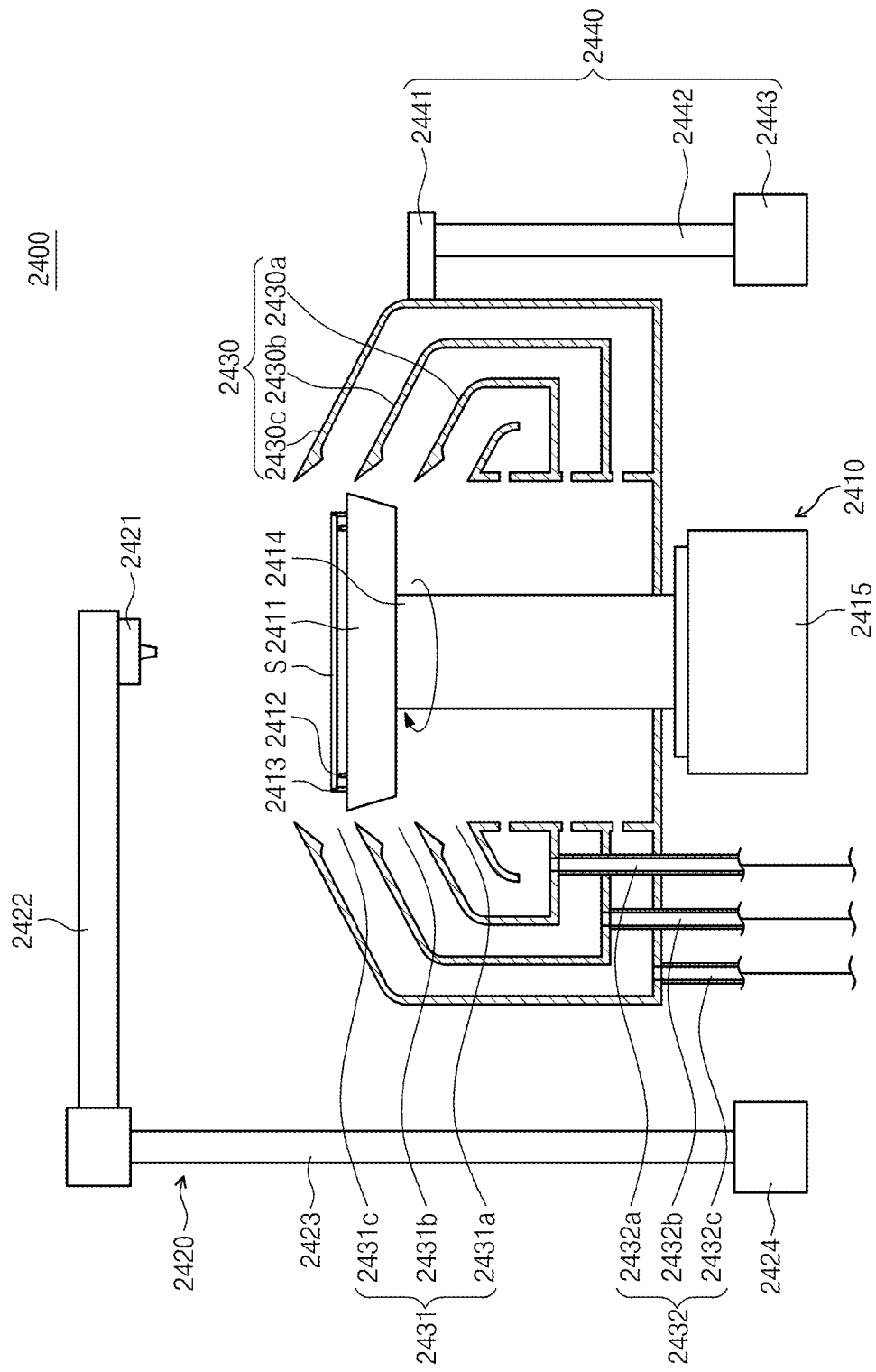
FIG. 2 is a cross-sectional view of a first process chamber of FIG. 1.

FIG. 2 is a cross-sectional view of a first process chamber of FIG. 1.

Referring to FIGS. 1 and 2, the first process chamber 2300 includes a housing 2310 and a process unit 2400. The first process is performed in the first process chamber 2300. Here, the first process may include at least one of the chemical process, the cleaning process, and the first drying process. As described above, the first drying process may be omitted.

The housing 2310 defines an outer wall of the first process chamber 230, and the process unit 2400 is disposed within the housing 2310 to perform the first process. The process unit 2400 includes a spin head 2410, a fluid supply member 2420, a recovery container 2430, and an elevation member 2440.

The substrate S is seated on the spin head 2410. Also, the spin head 2410 rotates the substrate S during the progression of the processes. The spin head 2410 may include a support plate 2411, a support pin 2412, a chucking pin 2413, a rotation shaft 2414, and a motor 2415.

The support plate 2411 has an upper portion having a shape similar to that of the substrate S. That is, the upper portion of the support plate 2411 may have a circular shape. The plurality of support pins 2412 on which the substrate S is placed and the plurality of chucking pins 2413 for fixing the substrate S are disposed on the support plate 2411. The rotation shaft 2414 rotated by the motor 2415 is fixed and coupled to a bottom surface of the support plate 2411. The motor 2415 generates a rotation force by using an external power source to rotate the support plate 2411 through the rotation shaft 2414. Thus, the substrate S may be seated on the spin head 2410, and the support plate 2411 may be rotated to rotate the substrate S while the first process is performed.

Each of the support pins 2412 protrudes from a top surface of the support plate 2411 in the third direction Z. The plurality of support pins 2412 are disposed spaced a preset distance apart from each other. When viewed from an upper side, the support pins 2412 may be arranged in a circular ring shape. A back surface of the substrate S may be placed on the support pins 2412. Thus, the substrate S is seated on the support pins 2412 so that the substrate S is spaced a protruding distance of each of the support pins 2412 spaced apart from the top surface of the support plate 2411 by the support pins 2412.

Each of the chucking pins 2413 may further protrude from the top surface of the support plate 2411 than each of the support pins 2412 in the third direction Z. Thus, the chucking pins 2413 may be disposed farther away from a center of the support plate 2411 than the support pins 2412. The chucking pins 2413 may be moved between a fixed position and a pick-up position along a radius direction of the support plate 2411. Here, the fixed position represents a position spaced a distance corresponding to a radius of the substrate S from the center of the support plate 2411, and the pick-up position represents a position away from the center of the support plate 2411 than the fixed position. The chucking pins 2413 are disposed at the pick-up position when the substrate S is loaded on the spin head 2410 by the transfer robot 2210. When the substrate S is loaded and then the process is performed, the chucking pins 2413 may be moved to the fixed position to contact a side surface of the substrate S, thereby fixing the substrate S in position. Also, when the process is finished and then the transfer robot 2210 picks the substrate S up to unload the substrate S, the chucking pins 2413 may be moved again to the pick-up position. Thus, the chucking pins 2413 may prevent the substrate S from being separated from the regular position by the rotation force when the spin head 2410 is rotated.

The fluid supply member 2420 may include a nozzle 2421, a support 2422, a support shaft 2423, and a driver 2424. The fluid supply member 2420 supplies a fluid onto the substrate S.

The support shaft 2423 is disposed so that a length direction thereof is parallel to the third direction Z. The driver 2424 is coupled to a lower end of the support shaft 2423. The driver 2424 rotates the support shaft 2423 or vertically moves the support shaft 2423 along the third direction Z. The support 2422 is vertically coupled to an upper portion of the support shaft 2423. The nozzle 2421 is disposed on a bottom surface of an end of the support 2422. The nozzle 2421 may be moved between a process position and a standby position by the rotation and elevation of the support shaft 2423 through the driver 2424. Here, the process position represents a position at which the nozzle 2421 is disposed directly above the support plate 2411, and the standby position represents a position at which the nozzle 2421 is disposed deviational from the direct upper side of the support plate 2411.

At least one fluid supply member 2420 may be provided in the process unit 2400. When the fluid supply member 2420 is provided in plurality, the plurality of fluid supply members 2420 may supply fluids different from each other, respectively. For example, each of the plurality of fluid supply members 2420 may supply a detergent, a rinsing agent, or an organic solvent. Here, a hydrogen ($H_2O_2$) solution, a solution in which ammonia ($NH_4OH$), hydrochloric acid (HCl), or sulfuric acid ($H_2SO_4$) is mixed with the hydrogen ($H_2O_2$) solution, or a hydrofluoric acid solution may be used as the detergent. Also, deionized (DI) water may be used as the rinsing agent, and isopropyl alcohol may be used as the organic solvent. Also, isopropyl alcohol, ethyl glycol, 1-propanol, tetrahydraulic franc, 4-hydroxyl, 4-methyl, 2-pentanone, 1-butanol, 2-butanol, methanol, ethanol, n-propyl alcohol, or dimethylether may be used as the organic solvent. For example, a first fluid supply member 2420a may spray the ammonia hydrogen peroxide solution, the second fluid supply member may spray the deionized water, and the third fluid supply member 2420c may spray the isopropyl alcohol solution.

When the substrate S is seated on the spin head 2410, the fluid supply member 2420 may be moved from the standby position to the process position to supply the fluid onto the substrate S. For example, the fluid supply part may supply the detergent, the rinsing agent, and the organic solvent to perform the chemical process, the cleaning process, and the first drying process, respectively. As described above, the spin head 2410 may be rotated by the motor 2415 to uniformly supply the fluids onto a top surface of the substrate S during the progression of the processes.

The recovery container 2430 provides a space in which the first process is performed. Also, the recovery container 2430 recovers the fluid used for the first process. When viewed from an upper side, the recovery container 2430 is disposed around the spin head 2410 to surround the spin head 2410 and has an opened upper side. At least one recovery container 2430 may be provided in the process unit 2400. Hereinafter, the process unit 2400 including three recovery containers 2430, i.e., a first recovery container 2430a, a second recovery container 2430b, and a third recovery container 2430c will be described as an example. However, the number of recovery containers 2430 may be differently selected according to the number of fluids and conditions of the first process.

Each of the first recovery container 2430a, the second recovery container 2430b, and the third recovery container 2430c may have a circular ring shape surrounding the spin head 2410. The first recovery container 2430a, the second recovery container 2430b, and the third recovery container 2430c may successively disposed away from a center of the spin head 2410. That is, the first recovery container 2430a surrounds the spin head 2410, the second recovery container 2430b surrounds the first recovery container 2430a, and the third recovery container 2430c surrounds the second recovery container 2430b. The first recovery container 2430a has a first inflow hole 2431a defined by an inner space thereof. The second recovery container 2430b has a second inflow hole 2431b defined by a space between the first recovery container 2430a and the second recovery container 2430b. The third recovery container 2430c has a third recovery container 2430c defined by a space between the second recovery container 2430b and the third recovery container 2430c. A recovery line 2432 extending downward along the third direction Z is connected to a bottom surface of each of the first, second, and third recovery container 2430a, 2430b, and 2430c. Each of the first, second, and third recovery lines 2432a, 2432b, and 2432c ventilates the fluids recovered into the first, second, and third recovery container 2430a, 2430b, and 2430c to supply the fluids into an external fluid recycling system (not shown). The fluid recycling system (not shown) may recycle the recovered fluids to reuse the fluids.

The elevation member 2440 includes a bracket 2441, an elevation shaft 2442, and an elevator 2443. The elevation member 2440 moves the recovery container 2430 in the third direction Z. The inflow hole 2421 of any one recovery container 2430 may have a variable relative height with respect to the spin head 2410 so that the inflow hole 2421 of any one recovery container 2430 is disposed on a horizontal surface of the substrate S seated on the spin head 2410. The bracket 2441 is fixed to the recovery container 2430. The bracket 2441 has one end fixed and coupled to the elevation shaft 2442 moved in the third direction Z by the elevator 2443. When the recovery container 2430 is provided in plurality, the bracket 2441 may be coupled to the outermost recovery container 2430. When the substrate S is loaded on the spin head 2410 or unloaded from the spin head 2410, the elevation member 2440 may move the recovery container 2430 downward to prevent the recovery container 2430 from interfering with a path of the transfer robot 2210 for transferring the substrate S.

Also, when a fluid is supplied by the fluid supply part and the spin head 2410 is rotated to perform the first process, the elevation member 2440 may move the recovery container 2430 in the third direction Z to locate the inflow hole 2431 of the recovery container 2430 on the same horizontal plan as the substrate S so that the fluid bouncing from the substrate S by a centrifugal force due to the rotation of the substrate S is recovered. For example, in a case where the first process is performed in an order of the chemical process by the detergent, the cleaning process by the rinsing agent, and the first drying process by the organic solvent, the first, second, and third inflow holes 2431a, 2431b, and 2431c may be moved to the same horizontal plane as the substrate S to recovery the fluids into the first, second, and third recovery containers 2430a, 2430b, and 2430c when the detergent, the rinsing agent, and the organic solvent are supplied, respectively. As described above, when the used fluids are recovered, environmental pollution may be prevented, and also, the expensive fluids may be recycled to reduce the semiconductor manufacturing costs.

The elevation member 2440 may move the spin head 2410 in the third direction Z, instead of moving the recovery container 2430.

Figure 3:
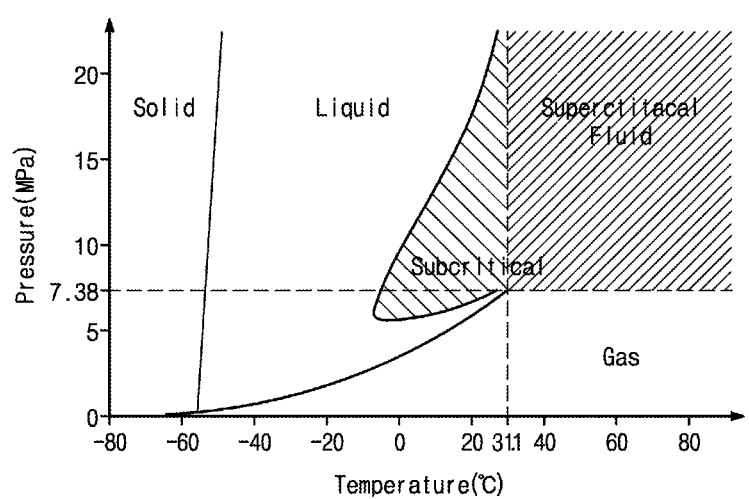
FIG. 3 is a view illustrating a phase transition of carbon dioxide.

FIG. 3 is a view illustrating a phase transition of carbon dioxide;

A supercritical fluid will be described with reference to FIG. 3.

The supercritical fluid represents a fluid in a state in which a material exceeds a critical temperature and a critical pressure, i.e., a material is not classified into liquid and gaseous states by reaching a critical state. The supercritical fluid has a molecular density similar to that of liquid and viscosity similar to that of gas. Since the supercritical fluid has very high diffusion, penetration, and dissolution, the supercritical fluid has an advantage of chemical reaction. Also, since the supercritical fluid does not exert an interface tension to a fine structure due to a very low surface tension thereof, drying efficiency may be superior when the semiconductor device is dried, and pattern collapse may be prevented. Hereinafter, a supercritical fluid of carbon dioxide ($CO_2$) mainly used for drying the substrate S will be described. However, the present invention is not limited to components and kinds of the supercritical fluid.

When carbon dioxide has a temperature of about 31.1° C. or more and a pressure of about 7.38 Mpa or more, the carbon dioxide may become in a supercritical state. The carbon dioxide may be nonpoisonous, nonflammable, and inert properties. Also, the supercritical carbon dioxide has a critical temperature and pressure less than those of other fluids. Thus, the supercritical carbon dioxide may be adjusted in temperature and pressure to easily control dissolution thereof. Also, when compared to water or other solvents, the supercritical carbon dioxide may have a diffusion coefficient less by about 10 times to about 100 times than that of the water or other solvents and a very low surface tension. Thus, the supercritical carbon dioxide may have physical properties suitable for performing the drying process. Also, the carbon dioxide may be recycled from byproducts generated by various chemical reactions. In addition, the supercritical carbon dioxide used in the drying process may be circulated and reused to reduce environmental pollution.

Figure 4:
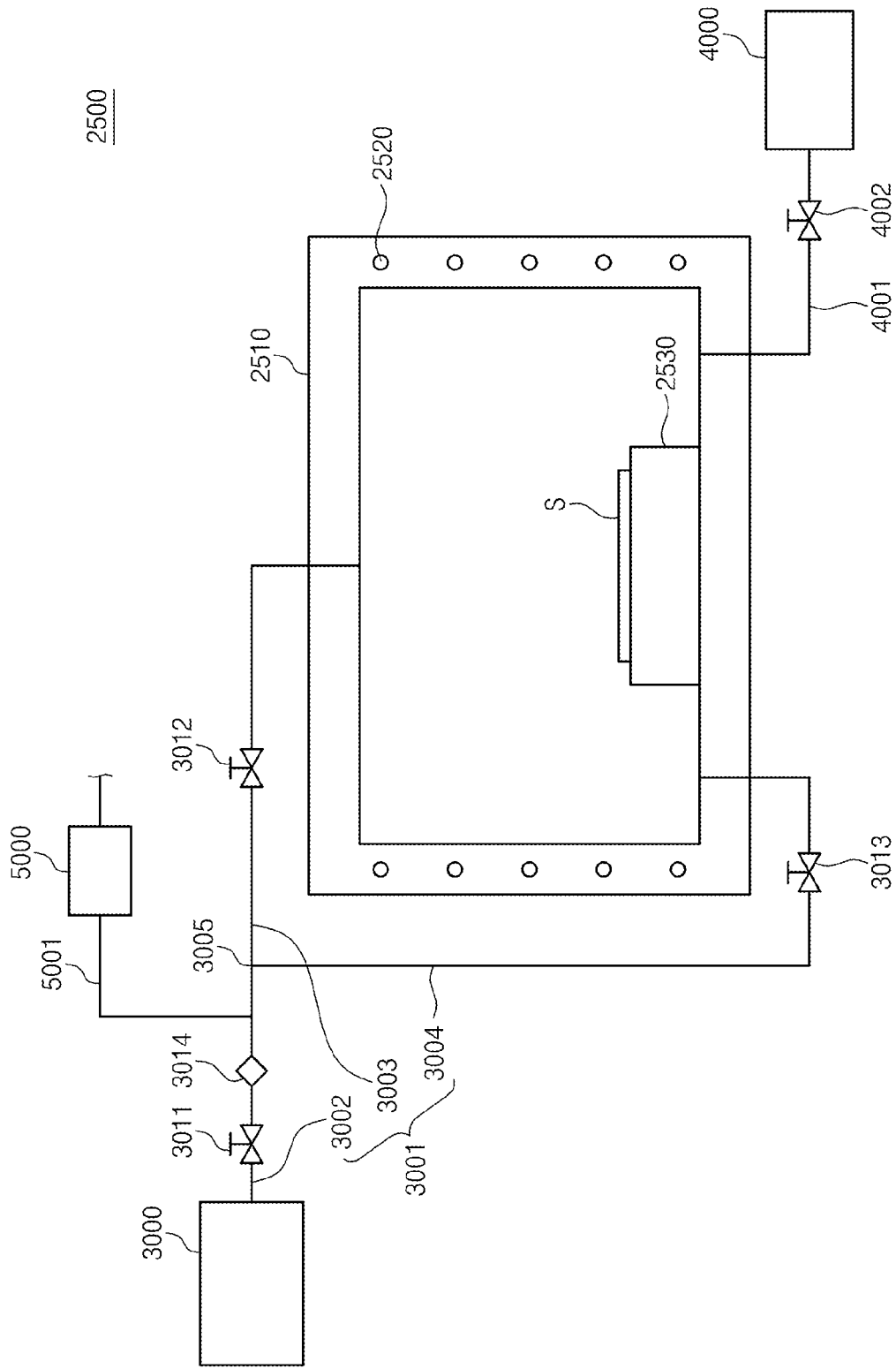
FIG. 4 is a view illustrating a tube of a second process chamber of FIG. 1.

FIG. 4 is a view illustrating a tube of a second process chamber of FIG. 1.

Referring to FIG. 4, the second process chamber 2500 includes a housing 2510, a heating member 2520, and a support member 2530. The second process is performed in the second process chamber 2500. Here, the second process may be a second drying process for drying the substrate S using a supercritical fluid.

The inside of the housing 2510 may provide a space which is sealed from the outside to dry the substrate S. The housing 2510 may be formed of a material enough to endure a high pressure. The heating member 2520 for heating the inside of the housing 2510 may be disposed between an inner wall and an outer wall of the housing 2510. Of cause, the present invention is not limited to a position of the heating member 2520. For example, the heating member 2520 may be disposed at a position different from the above-described position. The support member 2530 supports the substrate S. The support member 2530 may be fixed and installed within the housing 2510. Alternatively, the support member 2530 may not be fixed, but be rotated to rotate the substrate S seated on the support member 2530.

A supercritical fluid supply unit 3000 generates the supercritical fluid. For example, the supercritical fluid supply unit 3000 may apply a temperature greater than a critical temperature and a pressure greater than a critical pressure to dioxide to convert the dioxide into the supercritical fluid. The supercritical fluid generated in the supercritical fluid supply unit 300 is supplied into the housing 2510 through a supply tube 3001.

The supply tube 3001 includes a main tube 3002, an upper supply tube 3003, and a lower supply tube 3004. The main tube 3002 has one end connected to the supercritical fluid supply unit 3000. A branch part 3005 from which the upper supply tube 3003 and the lower supply tube 3004 are branched is disposed on the other end of the main tube 3002. The upper supply tube 3003 has one end connected to the branch part 3005 and the other end connected to an upper portion of the housing 2510. The lower supply tube 3004 has one end connected to the branch part 3005 and the other end connected to a lower portion of the housing 2510. Supply valves 3011, 3012, and 3013 are provided in the supply tube 3001. The main valve 3011 is disposed in the main tube 3002. The main valve 3011 may adjust an opening or closing of the main tube 3002 and an amount of supercritical fluid flowing into the main tube 3002. The upper valve 3012 and the lower valve 3013 may be disposed in the upper supply tube 3003 and the lower supply tube 3004, respectively. Each of the upper valve 3012 and the lower valve 3013 may adjust an opening or closing of each of the upper and lower supply tubes 3003 and 3004 and an amount of supercritical fluid of each of the upper and lower supply tubes 3003 and 3004. A filter 3014 is disposed between the branch part 3005 and the main valve 3011. The filter 3014 filters foreign substances from the supercritical fluid flowing into the supply tube 3001.

A discharge tube 4001 discharges the supercritical fluid and gas within the housing 2510 to the outside. The discharge tube 4001 has one end connected to the housing 2510 and the other end connected to a recycling unit 4000. A discharge valve 4002 is disposed in the discharge tube 4001. The discharge valve 4002 opens or closes the discharge tube 4001. Also, the discharge valve 4002 may adjust a flow rate of supercritical fluid flowing into the discharge tube 4001. The supercritical fluid discharged from the housing 2510 is received in the recycling unit 4000. The recycling unit 4000 removes the foreign substances contained in the supercritical fluid. For example, the supercritical fluid may be supplied into the supercritical fluid supply unit 300 or moved into a container storing the supercritical fluid after the foreign substances is removed therefrom.

A vent tube 5001 is branched from the main tube 3002. The vent tube 5001 is branched between the main tube 3002 and the branch part 3005. The supercritical fluid of the supply tube 3001 may be discharged to the outside through the vent tube 5001. For example, the vent tube 5001 may be connected to a tank (not shown). The supercritical fluid flowing into the vent tube 5001 may be collected in the tank and then wasted. A vent adjustment member 5000 opening or closing the tube or adjusting a flow rate of the supercritical fluid is disposed in the vent tube 5001.

Figure 5:
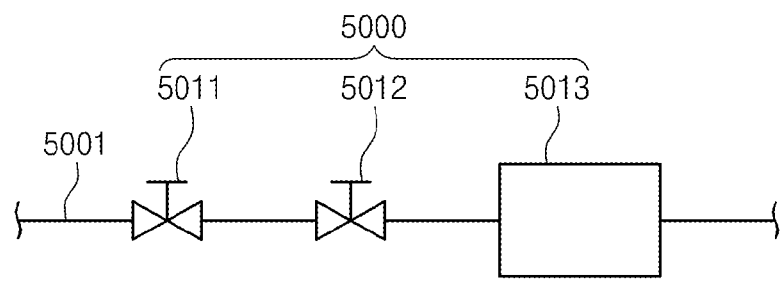
FIG. 5 is a view illustrating a vent adjustment member of FIG. 4.

FIG. 5 is a view illustrating a vent adjustment member of FIG. 4.

Referring to FIG. 5, the vent adjustment member 5000 includes a switching valve 5011, a check valve 5012, and a flow rate adjustment member 5013. Hereinafter, a portion of the vent tube 5001 adjacent to the supply tube 3001 is referred to as a front side, and a portion of the vent tube 5001 exposed to the outside is referred to as a rear side.

The vent tube 5001 may have a pressure less than that of the supply tube 3001. For example, a pump (not shown) may be disposed in the vent tube 5001. The pump discharges the supercritical fluid or gas within the vent tube 5001 to the outside. The switching valve 5011 is disposed at one point of the vent tube 5001. The switching valve 5011 may be disposed adjacent to the branch part 3005. The switching valve 5011 opens or closes the vent tube 5001. When the switching valve 5011 is opened, the supercritical fluid of the supply tube 3001 flows into the vent tube 5001 and then is discharged to the outside. Also, the switching valve 5011 adjusts an opened degree of the vent tube 5001 to adjust an amount of supercritical fluid flowing into the vent tube 5001.

The check valve 5012 is disposed at one point of the vent tube 5001. The check valve 5012 may be disposed between the branch part 3005 and the check valve 5012. Also, the check valve 5012 may be disposed on a side opposite to the branch part 3005 with respect to the switching valve 5011. The check valve 5012 may allow the supercritical fluid to flow in only one direction in the vent tube 5001. The check valve 5012 blocks a flow of the supercritical fluid from the vent tube 5001 toward the supply tube 3001.

The flow rate adjustment member 5013 is disposed in the vent tube 5001. For example, the flow rate adjustment member 5013 may be a metering valve. The metering valve adjusts an opened degree of the vent tube 5001 to adjust an amount of supercritical fluid flowing into the vent tube 5001. Also, the flow rate adjustment member 5013 may be an orifice. The orifice may have an inner diameter less than that of the vent tube 5001. Thus, the orifice may adjust an amount of supercritical fluid flowing into the vent tube 5001 without performing a separate controlling process. The supercritical fluid is throttled while passing through the orifice. The throttled supercritical fluid absorbs surrounding heat while being evaporated. The rear side of the vent tube 5001 with respect to the orifice may be frozen. When a portion of the vent tube 5001 at which the switching valve 5011 or the check valve 5012 are disposed is frozen, an operation of the switching valve 5011 or the check valve 5012 may be interrupted. Thus, the flow rate adjustment member 5013 may be disposed on the rear side of the switching valve 5011 and the check valve 5012.

Figure 6:
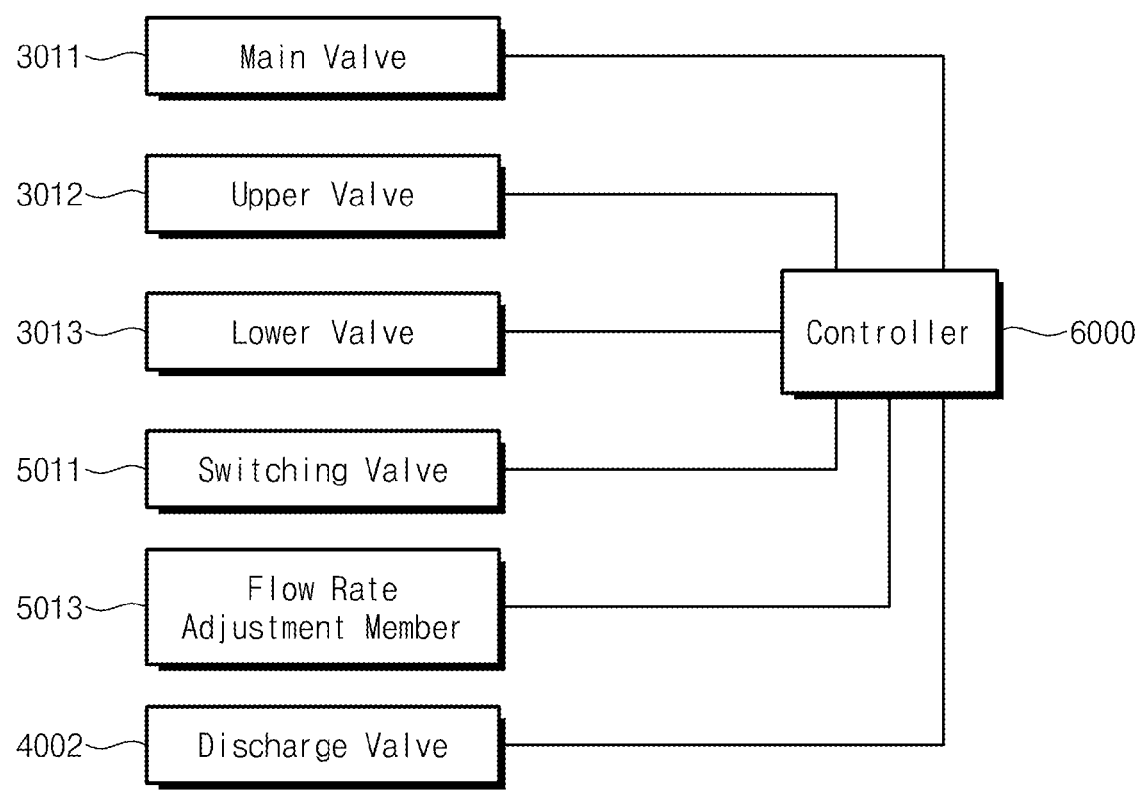
FIG. 6 is a view illustrating a connection relationship of a controller.

FIG. 6 is a view illustrating a connection relationship of a controller.

Referring to FIG. 6, a process in which a controller 6000 opens or closes the valves 3011, 3012, 3013, 4002, 5011, and 5013 will be described below. The valves 3011, 3012, 3013, 4002, 5011, and 5013 are connected to the controller 6000. When the flow rate adjustment member 5013 is provided as the metering valve, the flow rate adjustment member 5013 is connected to the controller 6000. The check valve is not connected to the controller 6000. The controller 6000 controls the valves 3011, 3012, 3013, 4002, 5011, and 5013 to open or close the supply tube 3001, the discharge tube 4001, or the vent tube 5001.

First, a process in which a second drying process is performed will be described. A substrate S loaded into the housing 2510 is disposed on the support member 2530. A door (not shown) provided on the housing 2510 shields the inside of the housing 2510 against the outside. Then, the supercritical fluid is supplied into the housing 2510. The controller 6000 closes the discharge valve 4002 and the switching valve 5011 and opens the main valve 3011, the upper valve 3012, and the lower valve 3013. The upper valve 3012 and the lower valve 3013 may be opened together with the main valve 3011 at the same time. Thus, the supercritical fluid may be supplied into upper and lower portions of the housing 2510 at the same time. Alternatively, one of the upper valve 3012 and the lower valve 3013 may be opened first, and then the other one may be opened. Thus, the supercritical fluid may be supplied first into the upper and lower portion of the housing 2510.

The supercritical fluid supplied into the housing 2510 dries the substrate S. While the second drying process is performed, the heating member 2520 heats an inner space. The heating member 2520 may heat a temperature greater than a critical temperature of the supercritical fluid. Thus, it may prevent a temperature of the supercritical fluid from decreasing to a temperature less than the critical temperature during the second drying process. While the second drying process is performed, the controller 6000 may open the discharge valve 4002. Thus, an amount of supercritical fluid within the housing 2510 may be maintained to a predetermined range during the second drying process. Here, the amount of supercritical fluid may be controlled so that an internal pressure of the housing 2510 is greater than a critical pressure of the supercritical fluid.

When the second drying process is completed, the main valve 3011, the upper valve 3012, and the lower valve 3013 may be closed to block the supply of the supercritical fluid. Then, the controller 6000 opens the discharge valve 4002 to discharge the supercritical fluid within the housing 2510 to the outside. The substrate S on which the second drying process is performed is unloaded from the housing 2510. Also, a new substrate S on which the second drying process will be performed is loaded into the housing 2510. The controller 6000 supplies the supercritical fluid again into the housing 2510 to perform the second drying process. Here, the supercritical fluid remaining in the supply tube 3001 may be supplied into the housing 2510. The supply tube 3001 may have a temperature less than a critical temperature or a pressure less than a critical pressure. Thus, a fluid remaining in the supply tube may be changed from a supercritical fluid state to a gaseous or liquid state. When the gaseous or liquid fluid is supplied into the housing 2510, the fluid may collide with the substrate S to damage or deform the substrate S. Thus, the vent tube 5001 may discharge the supercritical fluid remaining in the supply tube 3001.

The controller 6000 closes the main valve 3011, the upper valve 3012, and the lower valve 3013 and opens the switching valve 5011 to discharge the supercritical fluid remaining in the supply tube 3001. The discharge of the fluid remaining within the supply tube 3001 may be successively performed after the discharge of the supercritical fluid within the housing 2510. When the second drying process is completed, the controller 6000 closes the main valve 3011, the upper valve 3012, and the lower valve 3013 and opens the discharge valve 4002 to discharge the supercritical fluid within the housing 2510. The controller 6000 opens the switching valve 5011 to discharge the fluid remaining in the supply tube 3001 while unloading the substrate S and loading the new substrate S. When the substrate S is completely loaded, the controller 600 opens the main valve 3011, the upper valve 3012, and the lower valve 3013 to supply the supercritical fluid into the housing 2510. The discharge of the fluid remaining within the supply tube 3001 may be performed together with the discharge of the supercritical fluid within the housing 2510. The controller 6000 closes the main valve 3011, the upper valve 3012 and the lower valve 3013 and opens the discharge valve 4002 and the switching valve 5011. The supercritical fluid within the housing 2510 is discharged into the discharge tube 4001, and the fluid remaining in the supply tube 3001 is discharged into the vent tube 5001. Here, the upper valve 3012 and the lower valve 3013 may be closed to prevent the supercritical fluid from flowing backward into the supply tube 3001.

According to an embodiment of the present invention, the discharge of the supercritical fluid remaining in the supply tube and the supply of the supercritical fluid from the supercritical fluid supply unit into the housing may be successively performed. Thus, the supercritical fluid remaining in the supply tube is not introduced into the housing. Thus, the damage of the substrate S may be prevented.

Figure 7:
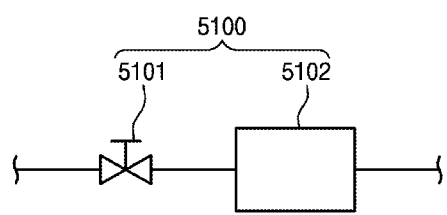
FIGS. 7 to 9 are views of a vent adjustment member according to another embodiment.
Figure 8:
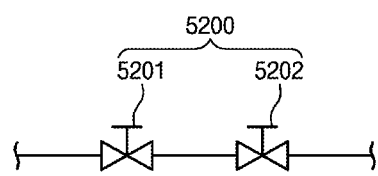
Figure 9:
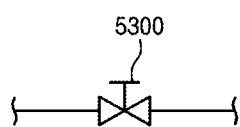

FIGS. 7 to 9 are views of a vent adjustment member according to another embodiment.

Referring to FIGS. 7 to 9, the check valve 5012 or the flow rate adjustment member 5013 in the vent adjustment member 5000 may be omitted.

A vent adjustment member 5100 of FIG. 7 includes a switching valve 5101 and a flow rate adjustment member 5102. A vent adjustment member 5200 of FIG. 8 includes a switching valve 5201 and a check valve 5202. A vent adjustment member 5300 of FIG. 9 is provided as a switching valve 5301. The switching valves 5101, 5201, and 5301, the check valve 5202, and the flow rate adjustment member 5102 are the same operation as those of the switching valve 5011, the check valve 5012, and the flow rate adjustment member 5013 of FIG. 5.

Figure 10:
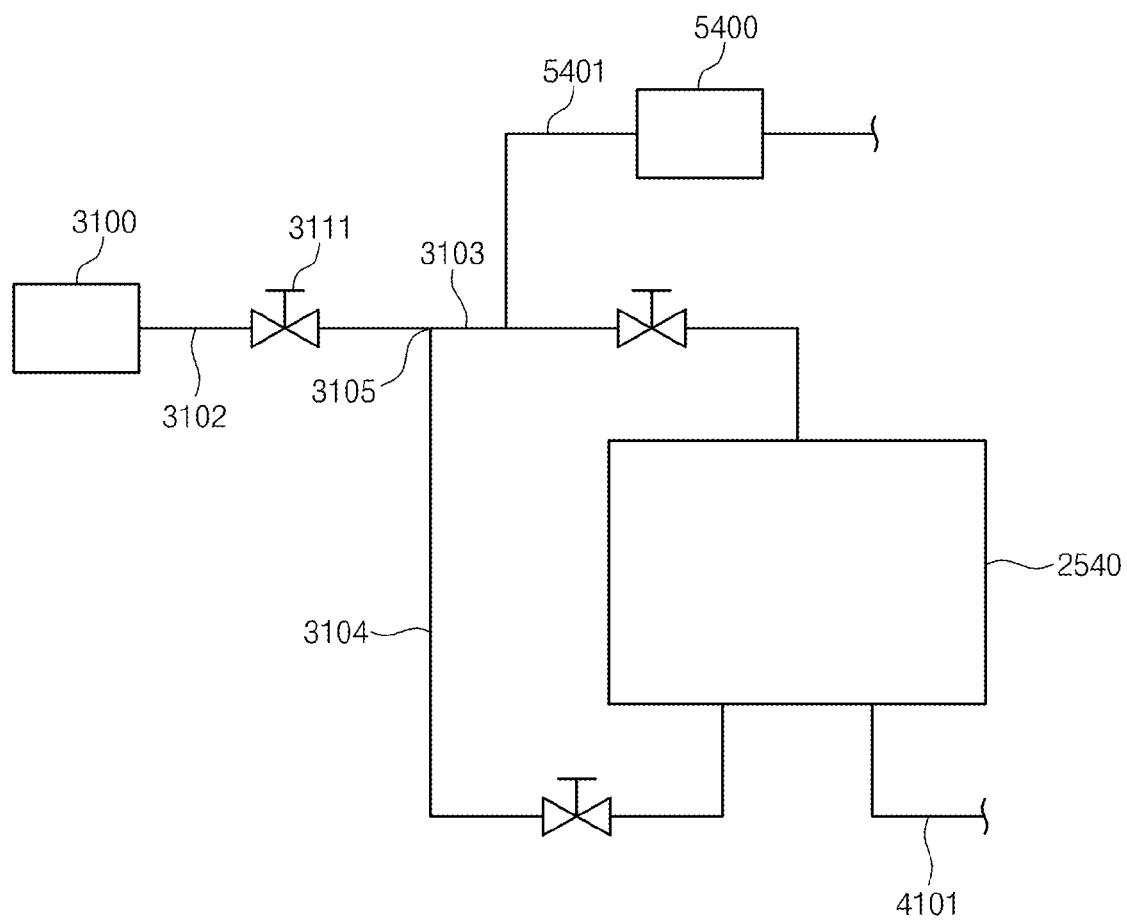
FIGS. 10 to 12 are views illustrating tubes of a second process chamber according to another embodiment.
Figure 11:
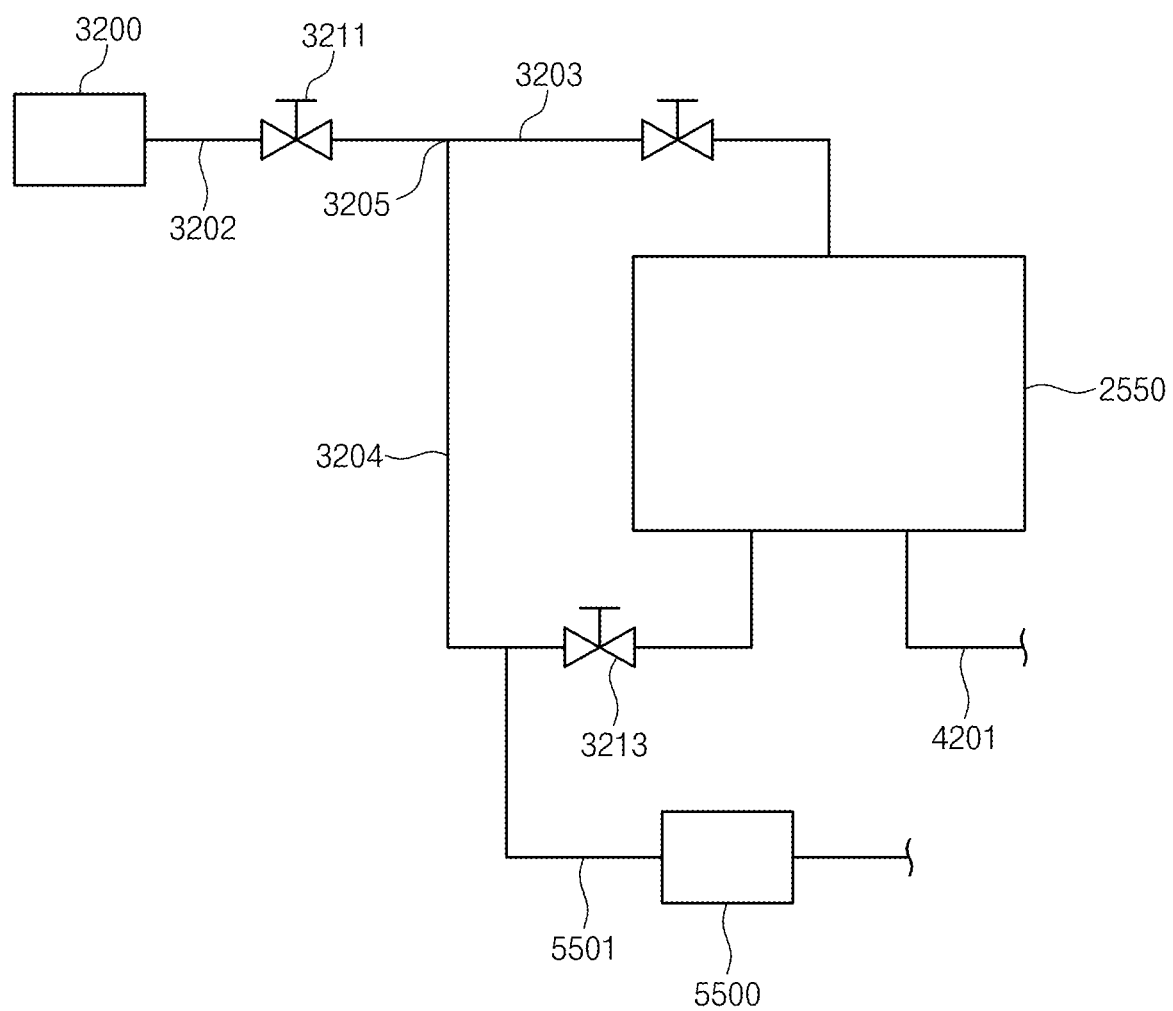
Figure 12:
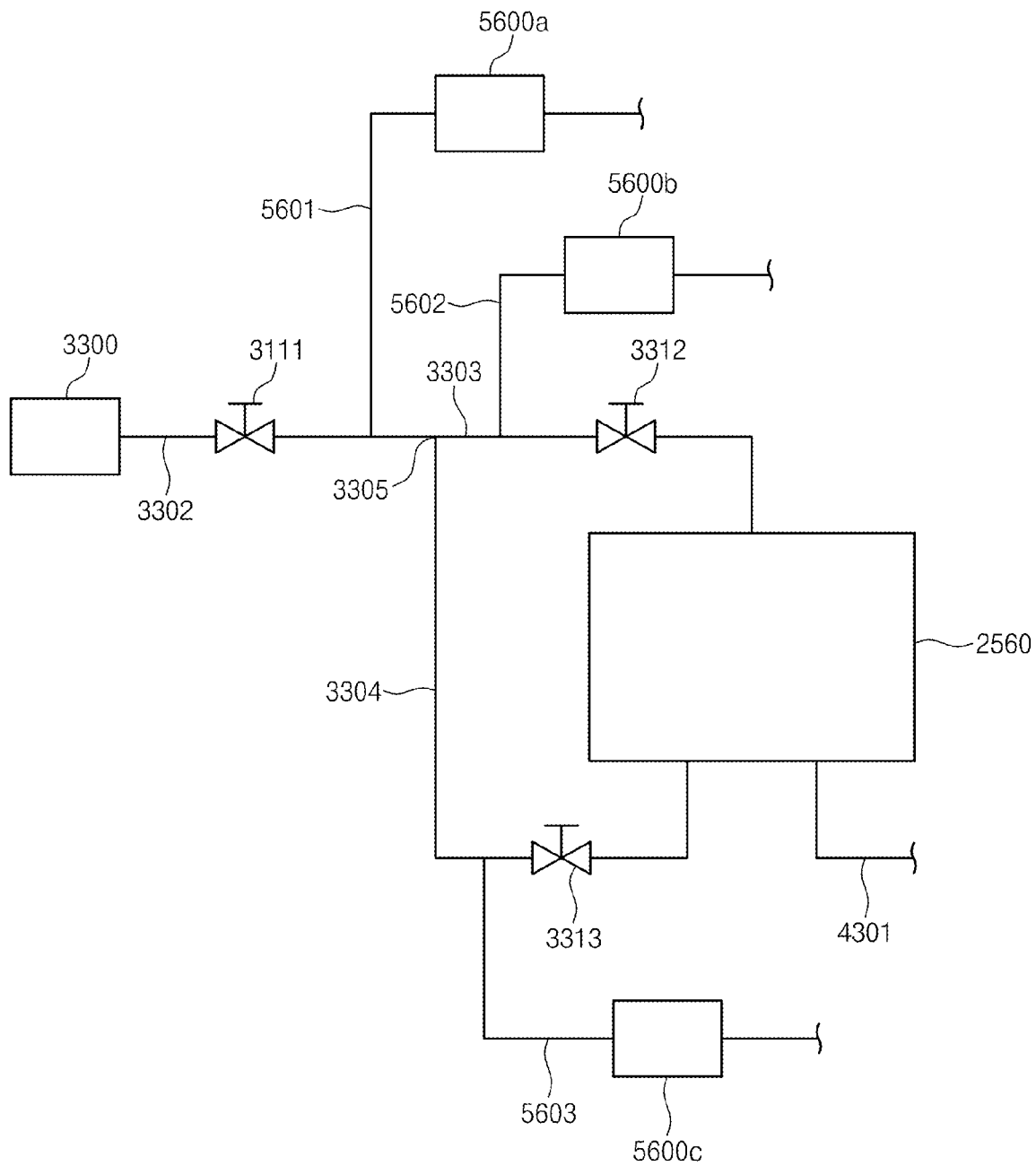

FIGS. 10 to 12 are views illustrating a tube of a second process chamber according to another embodiment.

Referring to FIG. 10, a vent tube 5401 may be branched from an upper supply tube 3103. The vent tube 5401 is branched between a branch part 3105 and an upper valve 3111. A supercritical fluid supply unit 3100, a housing 2540, a main tube 3102, the upper supply tube 3103, a lower supply tube 3104, a discharge tube 4101, and a vent adjustment member 5400 may have the same constitution as those of FIGS. 4 to 9.

Referring to FIG. 11, a vent tube 5501 may be branched from a lower supply tube 3204. The vent tube 5501 is branched between a branch part 3205 and a lower valve 3213. A supercritical fluid supply unit 3200, a housing 2550, a main tube 3202, a upper supply tube 3203, the lower supply tube 3204, a discharge tube 4201, and a vent adjustment member 5500 may have the same constitution as those of FIGS. 4 to 9.

Referring to FIG. 12, a plurality of vent tubes 5601, 5602, and 5603 may be provided. The vent tubes 5601, 5602, and 5603 may be branched from a main tube 3302, an upper supply tube 3303, and a lower supply tube 3304, respectively. The vent tubes 5601, 5602, and 5603 may be branched between the main tube 3311, the upper supply tube 3312, and the lower supply tube 3313 and a branch part 3305, respectively. Also, the vent tubes 5601, 5602, and 5603 may be selectively disposed at two positions in the main tube 3302, the upper supply tube 3303, and the lower supply tube 3304. A supercritical fluid supply unit 3300, a housing 2560, a main tube 3302, a upper supply tube 3303, the lower supply tube 3304, a discharge tube 4301, and vent adjustment members 5600a, 5600b, and 5600c may have the same constitution as those of FIGS. 4 to 9.

Figure 13:
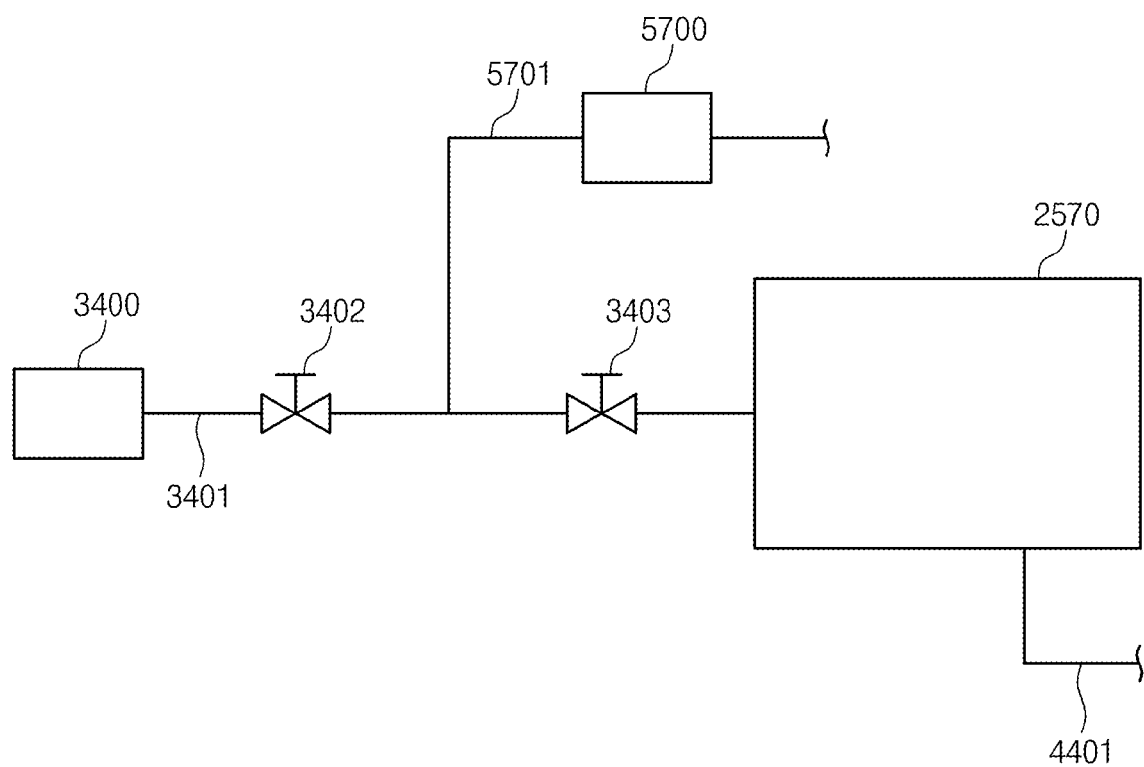
FIG. 13 is a view illustrating tubes of a second process chamber according to another embodiment.

FIG. 13 is a view illustrating tubes of a second process chamber according to another embodiment.

Referring to FIG. 13, a supercritical fluid supply unit 3400 is connected to a housing 2570 through a supply tube 3401. Supply valves 3402 and 3403 are disposed in the supply tube 3401. The front valve 3402 is disposed adjacent to the supercritical fluid supply unit 3400, and the rear valve 3403 is disposed adjacent to the housing 2570. A vent tube 5701 is branched between the front valve 3402 and the rear valve 3403. Also, the supply tube 3401 may be provided in plurality. Here, the vent tube 5701 may be disposed in each of the supply tubes 3401. The plurality of supply tubes 3401 may be connected to different portions of the housing 2750. For example, one supply tube 3401 may be connected to an upper portion of the housing 2570, and the other one supply tube 3401 may be connected to a lower portion of the housing 2570. The supercritical fluid supply unit 3400, the housing 2570, a vent adjustment member 5500, and a discharge tube 4401 may have the same constitution as those of FIGS. 4 to 9.

According to the embodiments of the present invention, it may prevent the supercritical fluid from remaining in the supply tube.

Also, according to the embodiments of the present invention, it may prevent the supercritical fluid remaining in the supply tube from being converted into a gaseous or liquid state.

Also, according to the embodiments of the present invention, it may prevent a fluid except for the supercritical fluid from being supplied into the housing.

Also, according to the embodiments of the present invention, it may prevent the substrate from being damaged due to the supply of the gas or liquid into the housing.

The foregoing detailed descriptions may be merely an example of the prevent invention. Having now described exemplary embodiments, those skilled in the art will appreciate that modifications may be made to them without departing from the spirit of the concepts that are embodied in them. Further, it is not intended that the scope of this application be limited to these specific embodiments or to their specific features or benefits. Rather, it is intended that the scope of this application be limited solely to the claims which now follow and to their equivalents.

What is claimed is:

1. An apparatus for treating a substrate using a supercritical fluid, the apparatus comprising:
   a housing;
   a support member disposed within the housing to support the substrate;
   a supercritical fluid supply unit in which the supercritical fluid is stored;
   a supply tube connecting the supercritical fluid supply unit to the housing; and
   a vent tube branched from the supply tube to discharge the supercritical fluid remaining in the supply tube,
   wherein a supply valve adjusting an amount of supercritical fluid supplied from the supercritical fluid supply unit into the housing is disposed in the supply tube,
   wherein a switching valve opening or closing the vent tube is disposed in the vent tube.

2. The apparatus of claim 1, wherein a flow rate adjustment member adjusting a flow rate of the supercritical fluid flowing into the vent tube is disposed in the vent tube.

3. The apparatus of claim 2, wherein the flow rate adjustment member comprises a metering valve or an orifice.

4. The apparatus of claim 2, wherein the flow rate adjustment member is disposed on a side opposite to a side at which the vent tube is connected to the supply tube with respect to the switching valve.

5. The apparatus of claim 1, wherein the supply tube comprises:
   a main tube having one end connected to the supercritical fluid supply unit;
   an upper supply tube branched from a branch part disposed on the other end of the main tube, the upper supply tube being connected to an upper portion of the housing; and
   a lower supply tube branched from the branch part, the lower supply tube being connected to a lower portion of the housing.

6. The apparatus of claim 5, wherein the vent tube is branched from one point of the main tube, the upper supply tube, or the lower supply tube.

7. The apparatus of claim 6, wherein the supply valve comprises a main valve, an upper valve, and a lower valve which are respectively disposed in the main tube, the upper supply tube, and the lower supply tube.

8. The apparatus of claim 7, wherein the vent tube is branched between the branch part and the main valve, the upper valve, or the lower valve.

9. The apparatus of claim 7, wherein a filter is disposed between the main valve and the branch part in the main tube.

10. The apparatus of claim 7, further comprising a controller controlling the supply valve and the switching valve,
wherein the controller opens the switching valve in a state where the supply valve is closed to discharge the supercritical fluid remaining in the supply tube through the vent tube.

11. The apparatus of claim 1, wherein the supply valve comprises a front valve adjacent to the supercritical fluid supply unit and a rear valve adjacent to the housing, and
the vent tube is branched between the front valve and the rear valve.

12. The apparatus of claim 11, further comprising a controller controlling the supply valve and the switching valve,
wherein the controller opens the switching valve in a state where the supply valve is closed to discharge the supercritical fluid remaining in the supply tube through the vent tube.

13. A method for treating a substrate using the substrate treating apparatus of claim 1, the method comprising:
opening the switching valve in a state where the supply valve is closed to discharge the supercritical fluid remaining the supply tube into the vent tube; and
closing the switching valve and opening the supply valve to supply the supercritical fluid into the housing.

14. The method of claim 13, wherein, while the supercritical fluid is discharged into the vent tube, the substrate is unloaded from the housing or loaded into the housing.

15. A method for treating a substrate using the substrate treating apparatus of claim 1, the method comprising:
when the substrate is completely dried, discharging the supercritical fluid remaining the supply tube while discharging the supercritical fluid within the housing in a state where introduction of the supercritical fluid from the supercritical fluid supply unit into the supply tube is blocked.

16. The method of claim 15, wherein, when the substrate is loaded into the housing, the supercritical fluid remaining in the supply tube is discharged into the vent tube, and supply of the supercritical fluid from the supercritical fluid supply unit into the housing through the supply tube starts.

* * * * *